(12) United States Patent
Dominique et al.

(10) Patent No.: US 7,395,492 B2
(45) Date of Patent: Jul. 1, 2008

(54) METHOD AND APPARATUS FOR DETECTING A PACKET ERROR IN A WIRELESS COMMUNICATIONS SYSTEM WITH MINIMUM OVERHEAD USING TAIL BITS IN TURBO CODE

(75) Inventors: Francis Dominique, Rockaway, NJ (US); Hongwei Kong, Denville, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 326 days.

(21) Appl. No.: 10/939,718

(22) Filed: Sep. 13, 2004

(65) Prior Publication Data

US 2006/0059402 A1    Mar. 16, 2006

(51) Int. Cl.
*H03M 13/03* (2006.01)
(52) U.S. Cl. .................. 714/794; 714/795; 375/262; 375/341
(58) Field of Classification Search ................. 714/794, 714/795; 375/262, 341
See application file for complete search history.

(56) References Cited

U.S. PATENT DOCUMENTS

| | | | | |
|---|---|---|---|---|
| 5,285,454 | A * | 2/1994 | Blaum et al. | 714/752 |
| 6,014,411 | A * | 1/2000 | Wang | 375/259 |
| 6,202,188 | B1 * | 3/2001 | Suzuki et al. | 714/758 |
| 6,574,289 | B1 * | 6/2003 | Tran et al. | 375/341 |
| 2004/0243903 | A1 * | 12/2004 | Pan et al. | 714/746 |

OTHER PUBLICATIONS

R.M. Pyndiah, "Near-Optimum Decoding of Product Codes: Block Turbo Codes", IEEE Transactions on Communications, vol. 46, No. 8, (Aug. 1998), pp. 1003-1010.*
Claude Berrou, "Near Optimum Error Correcting Coding and Decoding: Turbo-Codes", *IEEE Transactions on Communications*, vol. 44, No. 10, Oct. 1996, pp. 1261-1271.
Joachim Hagenauer, "Iterative Decoding Of Binary Block And Convolutional Codes", *IEEE Transactions On Information Theory*, vol. 42, No. 2, Mar. 1996, pp. 429-445.
L.R. Bahl, et al., "Optimal Decoding Of Linear Codes Fo Minimizing Symbol Error Rate", *IEEE Transactions On Information Theory*, Mar. 1974, pp. 284-287.

* cited by examiner

*Primary Examiner*—Joseph D Torres (57) ABSTRACT

The need for separate CRC bits is eliminated by taking advantage of what has been determined to be an embedded error detection capability of the tail bits generated by the constituent encoders of a turbo coder to perform error detection following turbo decoding. Specifically, it has been recognized that the tail bits are similar to CRC bits that would be generated by a CRC encoder that uses as its generating polynomial the feedback polynomial used by the turbo encoder. At the turbo decoder, after a final turbo decoding iteration cycle, a check is performed on the decoded systematic information bits by calculating the tail bits from the decoded information bits using that generating polynomial and bit-by-bit comparing the calculated tail bits with the systematic tail bits decoded by the turbo decoder. If a mismatch occurs at one or more bit positions, an error is indicated.

12 Claims, 6 Drawing Sheets

METHOD AND APPARATUS FOR DETECTING A PACKET ERROR IN A WIRELESS COMMUNICATIONS SYSTEM WITH MINIMUM OVERHEAD USING TAIL BITS IN TURBO CODE

TECHNICAL FIELD

This invention relates to wireless communications, and more particularly, to detecting a turbo-coded packet error at the receiver in a wireless communications system.

BACKGROUND OF THE INVENTION

In wireless communications systems, such as those operating in accordance with 3GPP2 CDMA2000-1x standards and 3GPP UMTS W-CDMA standards, a turbo code has been adopted for data transmission on both the uplink and downlink due to its superior error correcting capabilities. To detect the residue errors that cannot be corrected by the turbo decoder, Cyclic Redundancy Check (CRC) code bits are appended to the packet data before the encoder at the transmitter. A CRC check is then performed at the receiver on the decoded packet to determine whether a pass or fail results.

Figure 1:
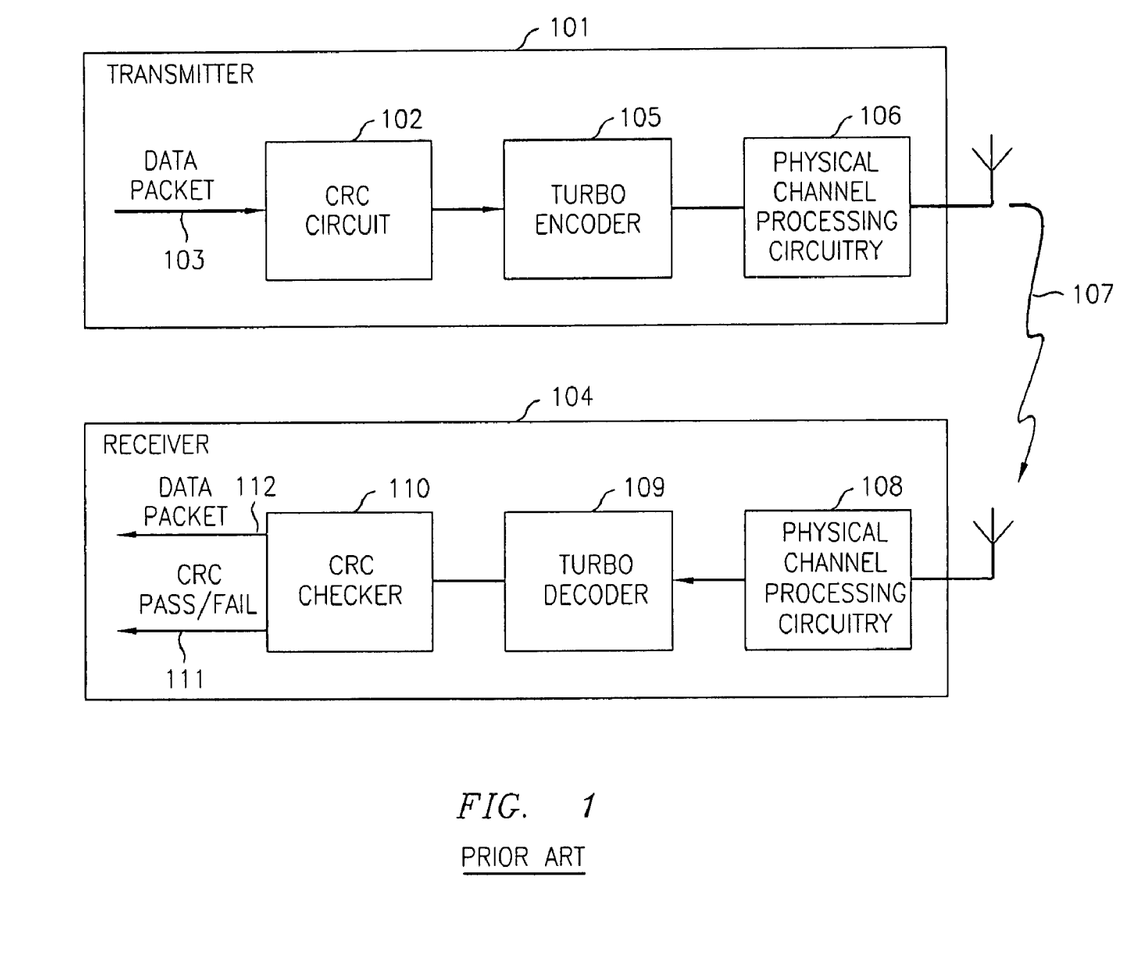
FIG. 1 shows a block diagram of a prior art wireless communications system employing separate CRC coding and turbo encoding.

FIG. 1 shows a high-level block diagram of wireless communications system that uses turbo encoding for error correction and CRC for error detecting. This block diagram is applicable to both 3GPP2 and 3GPP systems at the conceptual level. At the transmitter 101, which can be either within a mobile terminal or a base station, a CRC circuit 102 determines the CRC bits to be appended to a data packet on input 103 that is to be transmitted to receiver 104. Turbo encoder 105 then encodes the resultant block of data. The turbo-encoded packet is then processed by the physical channel processing circuitry 106, which performs such functions, for example, as spreading, scrambling, modulating and multiplexing for transmission over propagation channel 107 in accordance with the whatever system standards are being employed. At receiver 104, the physical channel processing circuitry 108 performs the opposite functions of circuitry 106, including de-multiplexing, demodulation, descrambling and despreading, to produce at its output a set of soft symbol metrics representing the data at the output of turbo encoder 105 in the transmitter. Turbo decoder 109 then processes these soft symbol metrics to produce a block of bits at its output that includes the CRC bits appended to the data packet on input 103 at the transmitter 101 by CRC circuit 102. Using the same methodology employed by CRC circuit 102 in the transmitter 101, CRC checker 110 performs a CRC check by calculating the CRC from those bits within the decoded data block at the output of turbo decoder 109 that correspond to the transmitted data packet. If the CRC determined by CRC checker 110 matches the CRC in the block of bits at the output of turbo decoder 109, then the received packet has passed its CRC check and no packet error is detected. CRC checker 110 then outputs a CRC Pass and the decoded data packet on outputs 111 and 112, respectively. If the CRC determined by CRC checker 110 doesn't match the CRC in the decoded block of bits at the output of turbo decoder 109, then the CRC has failed and a packet error is detected. CRC checker 110 then outputs a CRC Fail on output 111, which is reported to the higher layer.

Disadvantageously, CRC bits introduce overhead, and when the data block size is small, the overhead can be large. For example, in 3GPP2, the smallest data block length for the turbo code is 174 bits. The CRC for this block size comprises 12 bits thereby introducing an overhead of $10\log_{10}(1+12/174)=0.29$ dB. For 3GPP, the smallest data size for the turbo code is 40 bits. When a CRC of 24 bits is used, the overhead is $10\log_{10}(1+12/40)=2.04$ dB. It is desirable, therefore, to reduce the overhead introduced by CRC bits while still retaining the error detecting functionality that a CRC check affords.

SUMMARY OF THE INVENTION

The inventors have recognized that advantage can be taken of the tail bits generated by the two constituent encoders of a turbo encoder. The two constituent encoders encode such tail bits after all information bits in a packet or block of data have been encoded and are generated to restore each encoder to an all-zero state so as to be ready to encode a next data packet. Specifically, the inventors have recognized that these tail bits as generated by the turbo encoder and when decoded by the turbo decoder are similar to CRC bits that would be generated by a CRC encoder that uses as its generating polynomial the feedback polynomial $g_0(D)$ in the transfer function used in the turbo encoder by each constituent encoder in generating each constituent code. At the turbo decoder, after a final turbo decoding iteration cycle, a CRC check is performed on the decoded systematic information bits by calculating the CRC-like tail bits from those decoded information bits using $g_0(D)$ as the generating polynomial. The resultant calculated tail bits are then bit-by-bit compared with the systematic tail bits decoded by the turbo decoder. If a mismatch occurs at one or more bit positions, an error is indicated and the packet is marked as having failed. Advantageously, by using the tail bits for error checking, no additional bits need to be allocated and transmitted for packet error detection purposes.

In the exemplary embodiments for a 3GPP wireless transmission system each constituent encoder uses a third order feedback polynomial. Since only three tail bits are thus produced as output from each constituent encoder, the error detection capability afforded using these three bits alone is relatively weak for error detecting purposes. In a first embodiment, therefore, error checks are performed by separately comparing bit-by-bit the tail bits decoded by each of the turbo decoder's two constituent decoders against the tail bits calculated from the systematic information bits decoded by each of the two constituent decoders or from an interleaved or de-interleaved version thereof. A packet is determined to be error-free and have "passed" only if no error is found in any of the resultant four bit-by-bit comparisons. If any of the four comparisons indicates an error, then the packet is deemed to have "failed." This four-pronged testing methodology results in an overall error detection capability comparable to a six-bit CRC ($2^{-6}$), which is considerably better than the error detection capability of a three-bit CRC ($2^{-3}$). In a second embodiment, which is a simplified version of the first embodiment with a slightly degraded error detection performance as compared with the first embodiment, error checks are performed only on the systematic information bits decoded at the end of the final turbo decoding iteration cycle by bit-by-bit comparing the tail bits calculated from those decoded information bits with the tail bits decoded by the second constituent decoder, and by comparing the tail bits calculated from a de-interleaved version of those decoded information bits with the tail bits decoded by the first constituent decoder. A packet is deemed to have "passed" only if neither bit-by-bit comparison indicates an error.

DETAILED DESCRIPTION

As afore noted, turbo coding is widely used in third generation wireless system such as 3GPP and 3GPP2, as well as in broadband fixed wireless IEEE802.16 systems and in satellite communications. Turbo coding is a well known in the art type of coding using a concatenation of two component codes (see, e.g., C. Berrou and A. Glavieux, "Near Optimum Error Correcting Coding and Decoding: Turbo-Codes," *IEEE Trans. Commun.*, vol 44, pp. 1261-1271, October 1996, and J. Hagenauer, "Iterative Decoding of Binary Block and Convolutional Codes," *IEEE Trans. Information Theory*, vol. 42, pp. 429-445, March 1996). At the decoder, soft-decision decoding is performed on both received codes generating soft outputs (log-likelihood ratios). Specifically, decoding is split between the two codes by two decoders, one decoder exchanging the soft output with the other decoder after its own decoding, with the decoding being carried out multiple times, in a ping-pong manner, so that each iteration generates better quality more robust soft outputs. This iterative principle is similar to that of the turbo engine from whence the name "turbo codes" has been derived.

Figure 2:
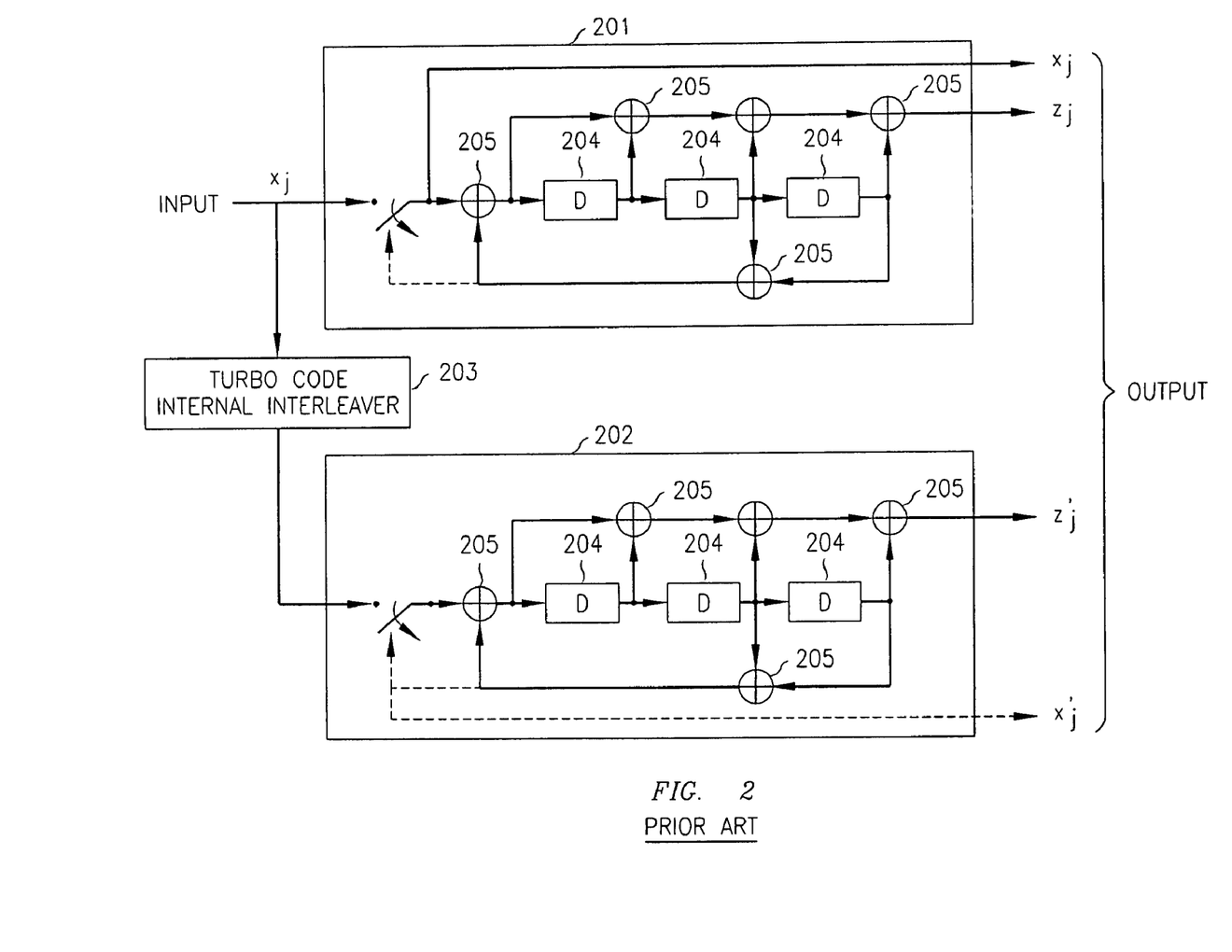
FIG. 2 is a block diagram of a prior art turbo encoder.

FIG. 2 shows a block diagram of an example of a rate ⅓ turbo encoder as is used in 3GPP wireless communications systems. The structure of this turbo encoder is a Parallel Concatenated Convolutional Coder (PCCC) with two identical eight-state ½ constituent systematic convolutional encoders 201 and 202 and one turbo code internal interleaver 203. Interleaving (and de-interleaving at the decoder) is performed to minimize the interactive effect that burst errors could impart to the log likelihood ratios determined for each component code at the decoder.

The transfer function of the eight-state constituent code for the PCCC is given by:

$$G(D) = \left[1, \frac{g_1(D)}{g_0(D)}\right], \quad (1)$$

where $g_0(D)$ is the feedback polynomial and is given by:

$$g_0(D)=1+D^2+D^3,$$

and where $g_1(D)$ is the feedforward polynomial and is given by:

$$g_1(D)=1+D+D^3.$$

When a data packet consisting of a set of K bits $\{x_j\}$ equal to $x_1, x_2, \ldots, x_K$, is inputted to the encoder, the entire packet is interleaved by internal interleaver 203 in a manner that is known to the decoder for de-interleaving purposes. The K bits within the interleaved packet, $\{x'_j\}$, are then sequentially inputted to the second constituent encoder 202 at the same time the K non-interleaved bits $\{x_j\}$ of the packet are sequentially inputted to the first constituent encoder 201. Constituent encoders 201 and 202, which are essentially identical, each includes three shift registers 204, which are all set at an initial value of zero before any of the packet bits are inputted. As each $x_j$ bit is inputted, encoder 201 codes that same bit into itself as a systematic bit, $x_j$, while also forming a parity bit, $z_j$. The parity bit is determined by the encoder structure comprising the shift registers 204 and modulo-2 adders 205 and is formed from a combination of previous input bits as shifted through, fed back, and combined with each other by the feedback shift register structure of encoder 201. As each interleaved $x'_j$ bit is inputted, encoder 202 similarly outputs a parity bit $z'_k$. Since the systemic bits from encoder 202 are only an interleaved version of the same systemic bits outputted by encoder 201, encoder 202 does not output $x'_j$. The output from the turbo encoder in response to the K bits of input packet $\{x_j\}$ thus consists of the outputs from constituent encoder 201 and constituent encoder 202 and is equal to:

$$x_1, z_1, z'_1, x_2, z_2, z'_2, \ldots x_K, z_K, z'_K.$$

As noted, $x_1, x_2, \ldots, x_K$ are the systematic bits inputted to both the first constituent encoder 201 and to the turbo code internal interleaver 203, K is the number of bits in the packet, and $z_1, z_2, \ldots, z_K$ and $z'_1, z'_2, \ldots, z'_K$ are the parity bits outputted from the first constituent encoder 201 and the second constituent encoder 202, respectively.

After all K information bits from the input packet have been inputted to encoders 201 and 202, trellis termination is performed by taking the tail bits from the shift register feedback. Specifically, first the constituent encoder 202 is disabled while the first three tail bits are used to terminate constituent encoder 201 by "moving" switch 206 in encoder 201 to its lower position. When in this lower position, a zero is shifted into the first shift register 204 as each bit is clocked through (since its input is the modulo 2 sum of two equal bits), and then sequentially into the other shift registers. Thus, after the tail bits $x_{K+1}, x_{K+2}$, and $x_{K+3}$ are clocked out, encoder 201 is in a desired all-zero state. Associated with these tail bits are parity bits $z_{K+1}, z_{K+2}$ and $z_{K+3}$, which are also clocked out. In a similar manner, the last three tail bits are used to terminate encoder 202 while the encoder 201 is disabled. Thus, with switch 207 in encoder 202 "moved" to its lower position, zeros are similarly clocked through each shift register 204 and tail bits $x'_{K+1}, x'_{K+2}$, and $x'_{K+3}$, and parity bits $z'_{K+1}, z'_{K+2}$ and $z'_{K+3}$ are clocked out. Since during trellis termination these $x'_j$ tail bits are not simply an interleaved version of the $x_j$ tail bits outputted by encoder 201, the turbo encoder transmits both $x_j$ and $x'_j$ for j=K+1 through j=K+3 during trellis termination. The transmitted bits for trellis termination are thus:

$$x_{K+1}, x_{K+2}, x_{K+1}, z_{K+1}, z_{K+2}, z_{K+3}, x'_{K+1}, x'_{K+2}, x'_{K+3}, z'_{K+1}, z'_{K+2}, z'_{K+3},$$

After each of these bits has been transmitted, all the shift registers 204 are in the desired zero state and ready to receive input of the bits in the next packet.

The inventors have recognized that the tail bits $\{x_{K+1}, x_{K+2}, x_{K+3}\}$ and $\{x'_{K+1}, x'_{K+2}, x'_{K+3}\}$ are "CRC-like" bits to the input data block to constituent encoders 201 and 202, respectively. These bits are "CRC-like" in that they are equivalent to the CRC bits that would be generated from the K-bit sequences $\{x_j\}$ and $\{x'_j\}$ using a CRC generator that uses $g_0(D)$ as its generating polynomial. This similarity to CRC bits can be seen in FIG. 3, in which each constituent encoder 201 and 202 in FIG. 2 has been redrawn in a manner showing its equivalence to a CRC generator. As in FIG. 2, each shift register 301 stores one bit and each adder 302 performs a modulo-2 addition. Switches 303, 304 and 305 are in the up position during input of bits $\{x_1, x_2, \ldots, x_K\}$ (or $\{x'_1, x'_2, \ldots, x'_K\}$), which input bits are outputted onto output 306. After the Kth input bit, each of the switches are moved to their down position. The next three bits then outputted onto output 306 are then the tail bits $\{x_{K+1}, x_{K+2}, x_{K+3}\}$ (or $\{x'_{K+1}, x'_{K+2}, x'_{K+3}\}$). For each input block of K bits, therefore, the systematic bits output on 306 consists of the K input bits plus the three tail bits, which are equivalent to the bits that would be produced by a third order CRC with $g_0(D)$ as its generating polynomial.

Figure 4:
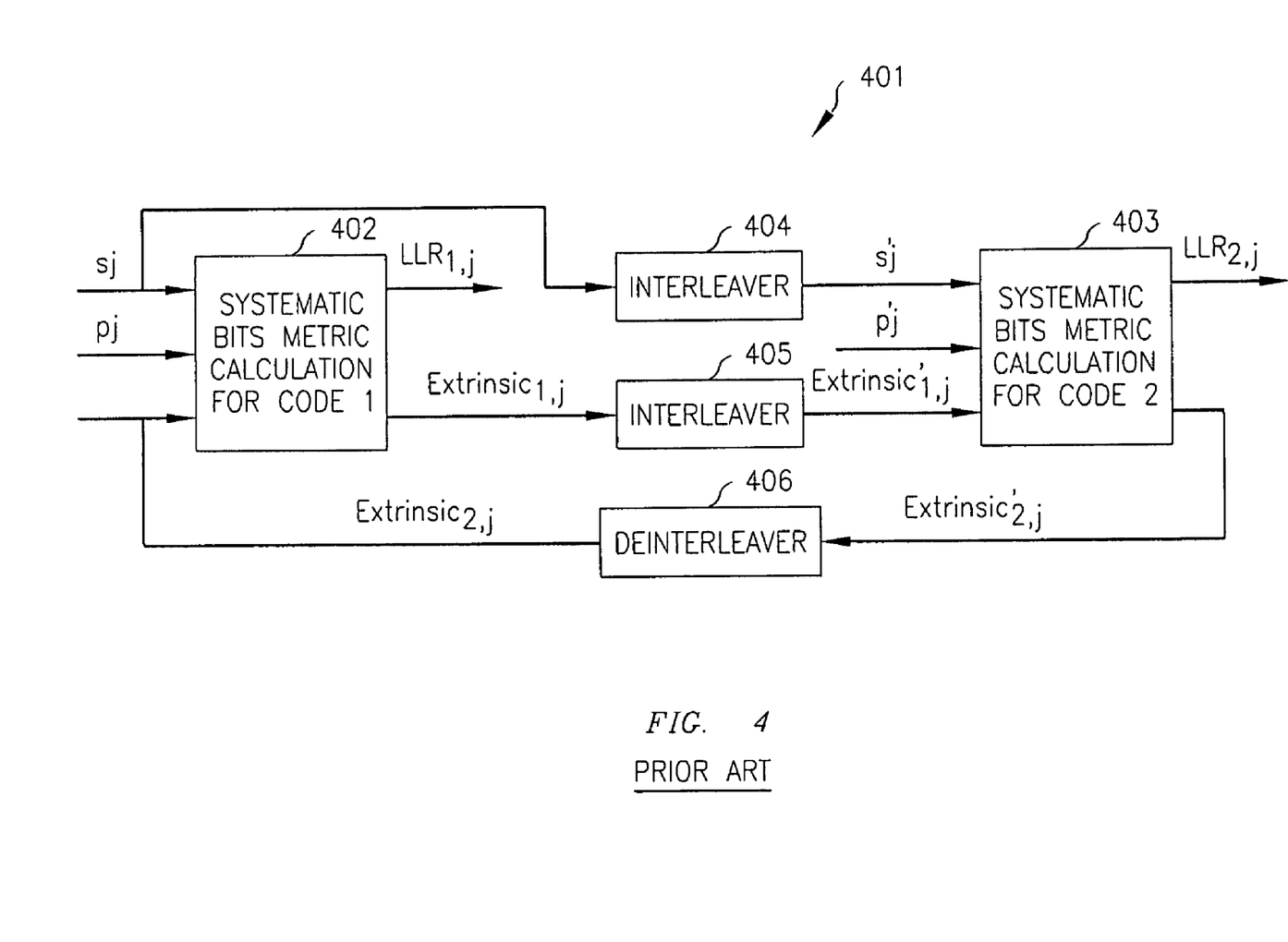
FIG. 4 is a block diagram of a prior art turbo decoder.

With reference to FIG. 4, a block diagram of a prior art turbo decoder 401 is shown. The inputs $s_j$, $p_j$ and $p'_j$ for j=1 to j=K are soft symbol metrics from the receiver demodulator and correspond to the transmit bits $x_j$ (the systematic bits), $z_j$ (first parity bit) and $z'_j$ (second parity bit) from FIG. 2, respectively. Before the decoder 401 starts to decode the received bits corresponding to an input packet, all the memory units in the interleavers and de-interleavers in the decoder are cleared to zero.

The decoding operation starts in block 402 with a systematic bits metric calculation for the first constituent code. This block essentially performs a BCJR algorithm (see, e.g., L. R. Bahl, J. Cocke, F. Jelinek, and J. Raviv, "Optimal Decoding of Linear Codes for Minimizing Symbol Error Rate," *IEEE Trans. Information Theory*, pp. 284-287, March 1974) to produce a log-likelihood ratio (LLR) for each systematic bit. The sign of the LLR represents the systematic bit value and its amplitude represents the likelihood. Thus, the higher the value of the LLR, the more likely that the bit value that is indicated by the LLR's sign is correct. If decoding were to be stopped after this sub-block 402 at the end of this first turbo decoding cycle, the decision for each bit in the packet delivered to the next higher layer for further processing or for a CRC check, would be determined by the sign of that bit's LLR, which would be mapped to a bit value by the following rule:

Non-positive LLR→1, Positive LLR→0.

The transmitted second constituent code, however, enables better performance, i.e., improved reliability, to be achieved. By feeding information derived from the first constituent decoder comprising systematic bit metric calculation block 402 to the systematic bits metric calculation block 403 for the second constituent code in a next turbo decoding cycle, advantage is taken of those systematic bit metrics (LLRs) generated from the first constituent decoder 402. Since the interleaving performed by interleaver 203 in the turbo encoder of FIG. 2 is known to the decoder 401, interleaver 404 interleaves the soft symbol metrics $s_j$ in accordance with the soft symbol metrics $p'_j$ that correspond to the parity bits $z'_j$ transmitted by the second constituent encoder 202. Input to the systematic bits metric calculation block 303 that constitutes the second decoder thus includes these interleaved soft symbol metrics $s'_j$ and the soft symbol metrics $p'_j$ corresponding to the second transmitted parity bit.

It can be noted that the received symbols metrics for the systematic bits ($s_j$ and $s'_j$) are shared by both systematic bits metric calculation blocks 402 and 403. The only information that is used by the first systematic bits metric calculation block 402 which cannot be directly used by the second systematic bits metric calculation block 403 is the parity bit soft symbols metrics, $p_j$, because, due to the turbo interleaving, the second systematic bits metric calculation block 403 doesn't recognize the parity bits from the first code. Therefore the information about the systematic bits that is derived from the parity bits in the first decoder is passed to the second systematic bits metric calculation block 403 of the second constituent decoder as a priori information about the systematic bits. That information is the Extrinsic$_{1,j}$ output of the first systematic bits metric calculation block 402, which is obtained from:

$$\text{Extrinsic}_{1,j} = LLR_{1,j} - s_j - \text{Extrinsic}_{2,j} \quad (2)$$

For the initial cycle of turbo decoding the first constituent code, the Extrinsic$_{2,j}$ term is zero for all j since the second decoder does not produce any outputs until after the first decoder has produced its first Extrinsic$_{1,j}$ output.

For the second turbo decoding cycle, the second systematic bits calculation block 403 calculates the LLRs for the interleaved systematic soft symbol metrics $s'_j$ at the output of interleaver 404 in the same manner as the first systematic bits calculation block 402 calculated the LLRs for the systematic soft symbol metrics $s_j$. The input soft symbol metrics are the interleaved versions of the soft symbol metrics $s_j$ in which the metrics corresponding to the tail systematic bits for the first constituent code are replaced with the soft symbol metrics corresponding to the tail bits of the second constituent code. The Extrinsic$_{1,j}$ outputs of the systematic bits metric calculation block 402 are interleaved by interleaver 405 to align with the order of the $s'_j$ values. The second systematic bits calculation block 403 produces the LLRs and the Extrinsic'$_{2,j}$, which represents information on the systematic bits carried by $p'_j$. This output is obtained from:

$$\text{Extrinsic}'_{2,j} = LLR2_{1,j} - s'_j - \text{Extrinsic}'_{1,j}. \quad (3)$$

If decoding were to stop at this point, the decision for each bit in the packet delivered to the next higher layer following the turbo decoder would be determined by the sign of that bit's LLR, which would be mapped to a bit value, as above, by the following rule:

Non-positive LLR→1, Positive LLR→0.

At this point, the turbo decoding concept comes into play by noticing that the LLR calculation in the systematic bits metric calculation for the first constituent code has not used the information carried by $p'_j$, corresponding to the parity bits for the second constituent code. This information is reflected in the Extrinsic'$_{2,j}$ output of equation (3) above. Therefore, once the Extrinsic'$_{2,j}$ outputs are available, they are de-interleaved by de-interleaver 406 to align with the order of the $s_j$ and $p_j$ values and fed back to the first systematic bits metric calculation block 402. The turbo decoding cycle performed therein is then repeated with the updated Extrinsic'$_{2,j}$ information to update both the LLR$_{1,j}$ and Extrinsic'$_{1,j}$ information calculated by that block. The updated information produced at this turbo decoding cycle can now be used to repeat the second systematic bits metric calculation. This process of iterative turbo decoding cycles can be made as many times as desired, with progressive performance improvement diminishing after about ten turbo decoding iteration cycles, where one turbo decoding iteration cycle is defined as a turbo decoding cycle performed by the first constituent decoder followed by a turbo decoding cycle performed by the second constituent decoder. Typically numbers of iteration cycles are between six and twelve. The final decision on the each information (systematic) bit j for j=1 to j=K is made based on the sign of or LLR$_{2,j}$.

As noted above, in recognizing the similarity between the tail systematic bits and the CRC bits, the inventors have determined that the tail bits can be used to detect residue errors from the turbo decoder. To use the tail bits in that manner, at the final turbo decoding iteration cycle, the first and second constituent decoders calculate the LLRs for the tail systematic bits for the first and second constituent codes, respectively, and then each decoder makes decisions of these tail bits using the decision rules noted above. Specifically, at the first turbo decoding cycle of the final turbo decoding iteration cycle, the LLRs for the tail bits of the first constituent code are calculated by the first systematic bits metric calculation block 402, and at the second turbo decoding cycle of the final turbo decoding iteration cycle, the LLRs for the tail bits of the second constituent code are calculated by the second systematic bits metric calculation block 403. Then, using the calculated LLRs for both the information bits and the tail bits of the first constituent code, the first constituent decoder decides on all the systematic bits (information and tail bits) of the first code, and using the calculated LLRs for both the information bits and the tail bits of the second constituent code, the second constituent decoder decides on all the systematic bits (information and tail bits) of the second code.

Figure 5:
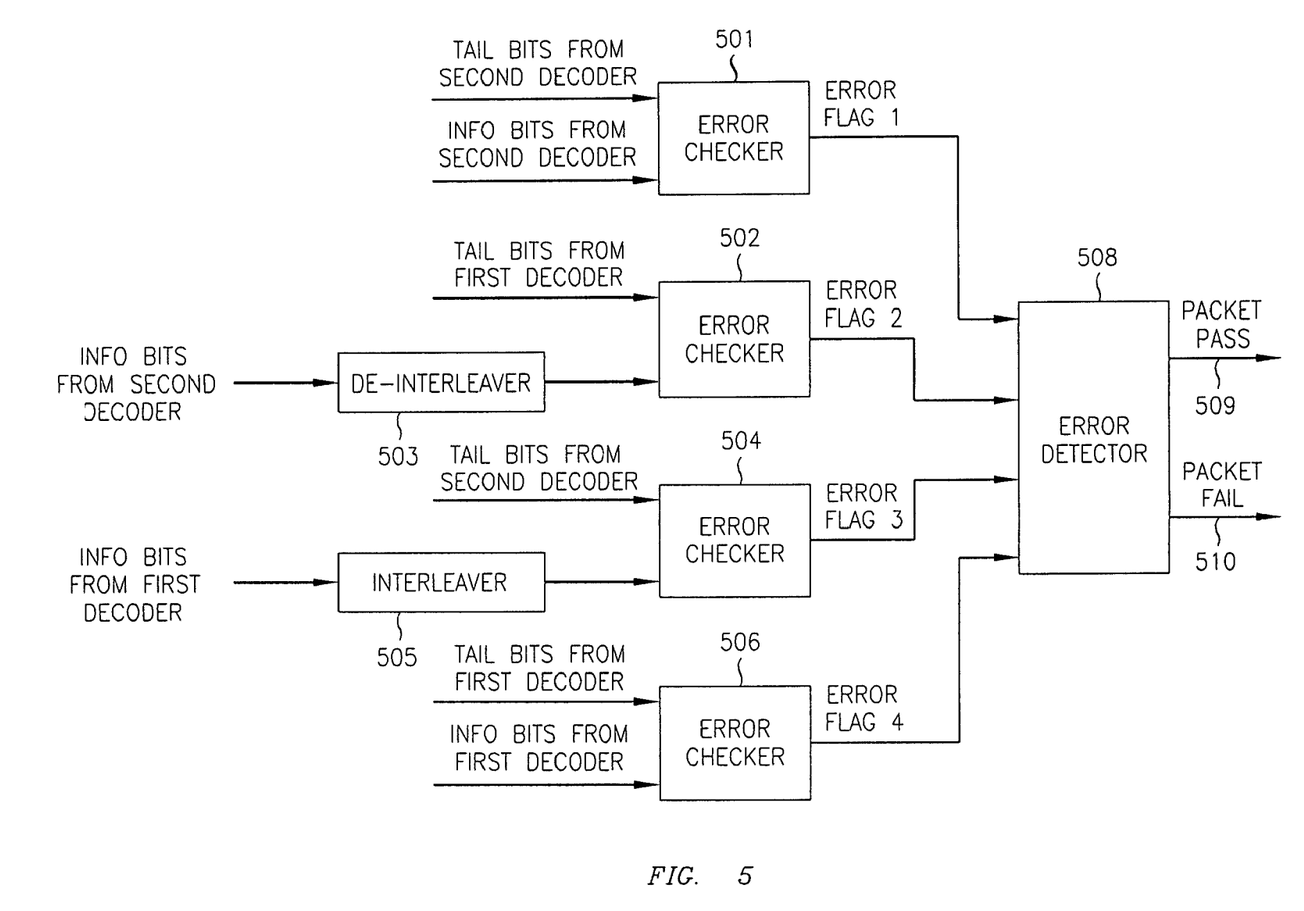
FIG. 5 is a block diagram showing error detection processing using tail bits in accordance with a first embodiment of the present invention.

Once the systematic information and tail bits have been decoded for each constituent code, error checking is performed by performing an error check in a CRC-like manner by applying the polynomial $g_0(D)$ to the decoded information bits and comparing the resultant calculated tail bits with the tail bits decoded by the constituent decoders. FIG. 5 shows the error detection processing that is performed on the information bits and tail bits decoded by the first and second constituent decoders at the first and second turbo decoding cycles, respectively, of the final turbo decoding iteration cycle. Specifically, error checker 501 performs an error check on the information bits derived by the second constituent decoder by comparing the tail bits calculated from those information bits with the tail bits decoded by the second constituent decoder. Similarly, error checker 502 performs an error check on the information bits derived by the second constituent decoder by comparing the tail bits calculated from those information bits with the tail bits decoded by the first constituent decoder. Before the tail bits are calculated, however, de-interleaver 503 de-interleaves the information bits decoded by the second constituent decoder to align them properly with the order of the information bits used by the first constituent decoder to decode its tail bits. Error checker 504 performs an error check on the information bits decoded by the first constituent decoder by comparing the tail bits calculated from those information bits with the tail bits decoded by the second constituent decoder. For this check, before the tail bits are calculated, interleaver 505 interleaves the information bits from the first constituent decoder to align them properly with the order of the information bits used by the second constituent decoder to decode its tail bits. Finally, checker 506 performs an error check on the information bits derived by the first constituent decoder by comparing the tail bits calculated from those information bits with the tail bits decoded by the first constituent decoder.

Figure 3:
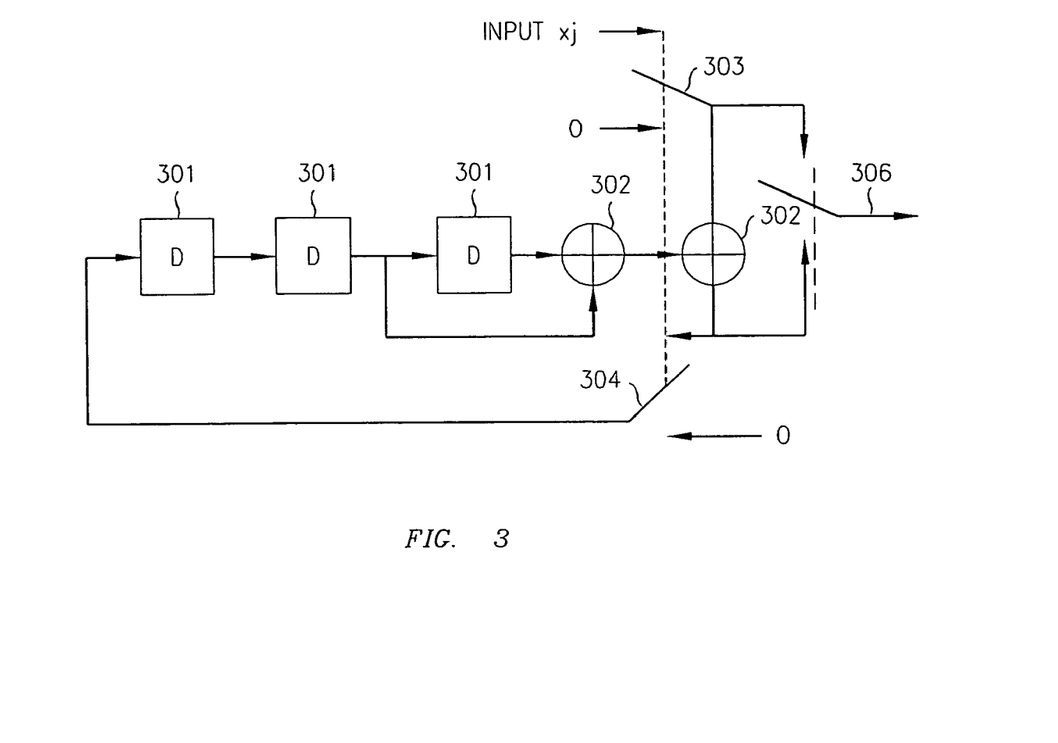
FIG. 3 is a block diagram showing the similarity between the tail bits generated in the encoder of FIG. 2 and CRC bits.
Figure 6:
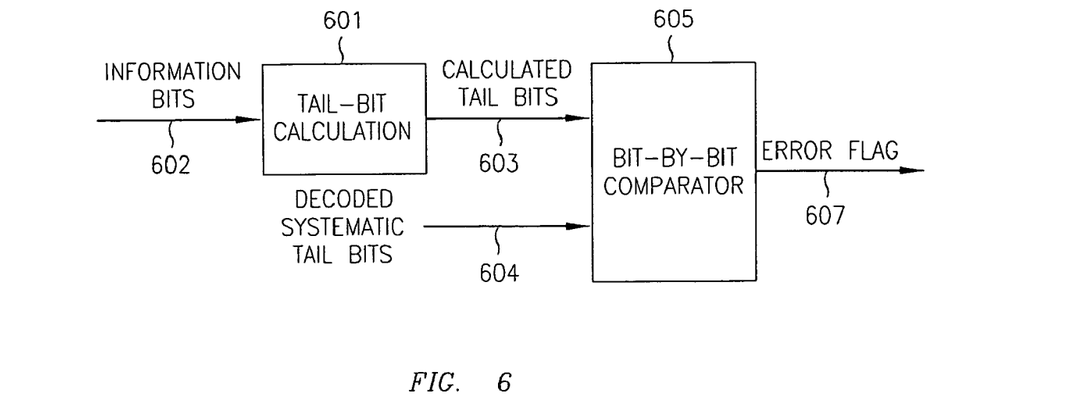
FIG. 6 is a block diagram showing the processing by the error checkers in FIG. 5.

Each error checker in FIG. 5 performs a conventional CRC-like check process, as in shown in FIG. 6. Thus, the information bits decoded by the first or second constituent decoder are inputted either directly inputted to a tail-bit calculator 601, or are de-interleaved or interleaved depending upon with which decoded tail bits the calculated tail bits are to be compared. Tail-bit calculator 601 calculates the tail bits from the bits on its input 602 using the same generator as shown in FIG. 3, which has as its generating polynomial the same $g_0(D)$ used by the turbo encoder to generate the tail bits for the first and second constituent encoders. If no error has occurred, the calculated tail bits produced by tail-bit calculator 601 on output 603 should be the same as the systematic tail bits on input 604 as decoded by the appropriate constituent decoder. Comparator 605 performs a bit-by-bit comparison between the calculated tail bits on output 603 with the decoded systematic tail bits on input 604. If they do not match at all bit positions, comparator 605 outputs an error flag on output 607.

With reference again to FIG. 5, the outputs of error checkers 501, 502, 504, and 506 are inputted to packet error detector 508. If no error flag (Error Flag 1, Error Flag 2, Error Flag 3, or Error Flag 4) is present on any error checker output, then the packet is determined to be error free and error detector 508 outputs a "pass" on output 509. If an error flag is present on any error checker output, then the packet is determined to be in error and error detector 508 outputs a "fail" on output 510. In this embodiment, error checking is done four times: a check between the information bits and tail bits from the first constituent decoder, a check between the information bits and tail bits from the second constituent decoder, a check between the information bits from the first constituent decoder and the tail bits from the second constituent decoder, and a check between the information bits from the second constituent decoder and the tail bits from the first constituent decoder. This crosschecking is performed because in this embodiment there are only three CRC-like tail bits in each constituent code. For a three-bit CRC, the error detection capability is in the order of $2^{-3}$ for a single constituent code, which is relatively weak. By crosschecking, an error detection capability comparable to a six-bit CRC is achieved ($2^{-6}$), which is generally considered to be the minimum acceptable CRC length for reliable communication. It should be noted, however, that in other embodiments in which the turbo coder uses a higher order feedback polynomial in its transfer function, such as a sixth order or higher, crosschecking would not be necessary. In such a situation, a single check at the end of a final turbo decoding iteration cycle of the tail bits calculated from the decoded information bits and the decoded tail bits would have a sufficient error detecting capability.

Figure 7:
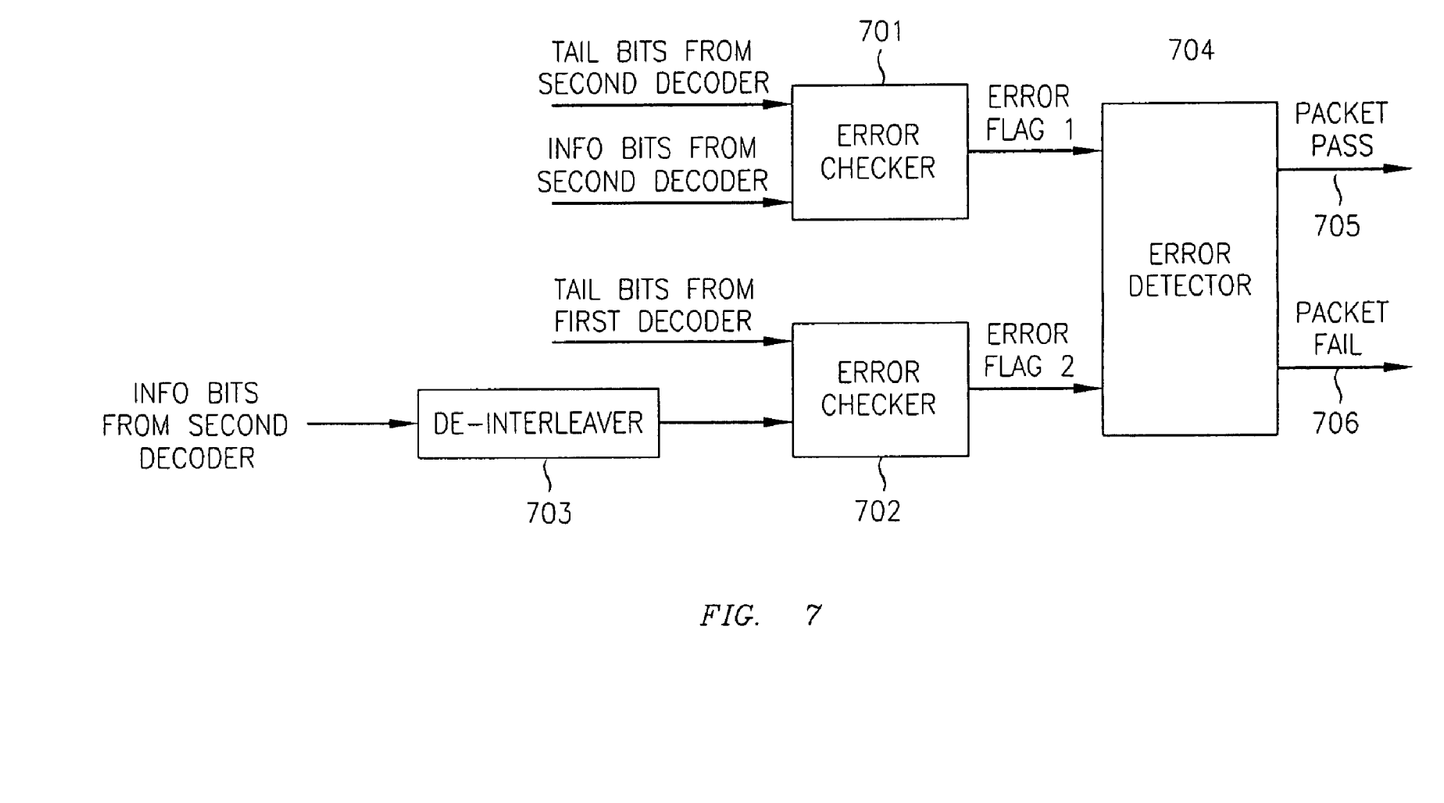
FIG. 7 is a block diagram showing error detection processing in accordance with a second embodiment of the present invention.

At the cost of a slightly degraded error detection performance from the embodiment in FIG. 5, that embodiment can be simplified to the embodiment shown in FIG. 7. In this embodiment, only the information bits decoded by the second constituent decoder at the end of a final turbo decoding iteration cycle are used. Thus, as shown, error checker 701 checks the tail bits calculated from the information bits decoded by the second constituent decoder against the tail bits decoded by the second constituent decoder. If there is not a bit-by-bit match, an error flag (Error Flag 1) is generated. Error checker 702 checks tail bits decoded by the first constituent decoder against the tail bits calculated from information bits decoded by the second constituent decoder, the latter bits being de-interleaved by de-interleaver 703 to align them in the order in which the first constituent encoder encoded them. Again, if there is not a bit-by-bit match, an error flag (Error Flag 2) is generated. Packet error detector 704 outputs a packet "pass" on output 705 if neither packet checker 701 nor packet checker 702 outputs an error flag. If either packet checks outputs an error flag, packet error detector 704 outputs a packet "fail" on output 706.

While the particular invention has been described with reference to the illustrative embodiments, this description should not be construed in a limiting sense. It is understood that although the present invention has been described, various modifications of the illustrative embodiments, as well as additional embodiments of the invention, will be apparent to one of ordinary skill in the art upon reference to this description without departing from the spirit of the invention, as recited in the claims appended hereto. Although being noted as applicable to 3GPP2 CDMA2000-1x and 3GPP UMTS W-CDMA standards, the present invention could be implemented in any CDMA or non-CDMA, wireless or wired electrical or optical communication system that uses turbo encoding and decoding. Further, the invention may be implemented in different locations, such as a base station (NodeB in UMTS terminology) or a mobile terminal (UE in UMTS terminology), or anywhere else where turbo decoding might be performed. The processing circuitry required to implement and use the described invention may be implemented in application specific integrated circuits, software-driven processing circuitry, firmware, programmable logic devices, hardware, discrete components or arrangements of the above components as would be understood by one of ordinary skill in the art with the benefit of this disclosure. Those skilled in the art will readily recognize that these and various other modifications, arrangements and methods can be made to the present invention without strictly following the exemplary applications illustrated and described herein and without departing from the spirit and scope of the present invention. It is therefore contemplated that the appended claims will cover any such modifications or embodiments as fall within the true scope of the invention.

The invention claimed is:

1. A method at a turbo decoder for detecting an error in a block of decoded information bits comprising the steps of:
    calculating from the decoded information bits, tail bits expected to be decoded in association with the decoded information bits;
    comparing on a bit-by-bit basis the calculated tail bits with actual tail bits decoded in association with the decoded information bits; and
    determining from the results of the bit-by-bit comparisons whether or not there is an error in the block of decoded information bits,
    wherein the expected tail bits are calculated using a generating polynomial that is the same as a feedback polynomial used in turbo coding the information and tail bits.

2. The method of claim 1 wherein the step of determining determines that there is an error if one or more comparisons of corresponding bit values does not match.

3. The method of claim 1 wherein the step of determining determines that there is no error if the comparisons of corresponding bit values all match.

4. The method of claim 1 wherein the tail bits decoded by the second constituent decoder are bit-by-bit compared with tail bits calculated from corresponding information bits decoded by the second constituent decoder, and wherein the tail bits decoded by the first constituent decoder are bit-by-bit compared with tail bits calculated from information bits derived from the information bits decoded by the second constituent decoder, an error being determined if in either of the bit-by-bit comparisons one or more comparisons of corresponding bit values does not match.

5. The method of claim 1 wherein the tail bits decoded by the second constituent decoder are bit-by-bit compared with corresponding tail bits calculated from information bits decoded by the second constituent decoder, wherein the tail bits decoded by the first constituent decoder are bit-by-bit compared with corresponding tail bits calculated from information bits derived from the information bits decoded by the second constituent decoder, wherein the tail bits decoded by the first constituent decoder are bit-by-bit compared with corresponding tail bits calculated from information bits decoded by the first constituent decoder, and wherein the tail bits decoded by the second constituent decoder are bit-by-bit compared with corresponding tail bits calculated from information bits derived from the information bits decoded by the first constituent decoder, an error being determined if in any of the bit-by-bit comparisons one or more comparisons of corresponding bit values does not match.

6. The method of claim 1 wherein the step of calculating is performed at the end of a final turbo decoding iteration cycle, the final turbo decoding iteration cycle comprising a first turbo decoding cycle in which a first constituent decoder decodes information bits and associated tails bits of a first constituent code and a next second turbo decoding cycle in which a second constituent decoder decodes information bits and tail bits associated with a second constituent code.

7. Apparatus for detecting an error in a block of bits decoded by a turbo decoder that comprises a first constituent turbo decoder and a second constituent turbo decoder, the apparatus comprising:
    means for calculating from the decoded information bits, tail bits expected to be decoded in association with the decoded information bits;
    means for comparing on a bit-by-bit basis the calculated tail bits with actual tail bits decoded in association with the decoded information bits; and
    means for determining from the results of the bit-by-bit comparisons whether or not there is an error in the block of decoded information bits ,
    wherein the calculating means calculates the expected tail bits using a generating polynomial that is the same as a feedback polynomial used in turbo coding the information and tail bits.

8. The apparatus of claim 7 wherein the determining means determines that there is an error if one or more comparisons of corresponding bit values does not match.

9. The apparatus of claim 7 wherein the determining means determines that there is no error if the comparisons of corresponding bit values all match.

10. The apparatus of claim 7 wherein the tail bits decoded by the second constituent decoder are bit-by-bit compared with tail bits calculated from corresponding information bits decoded by the second constituent decoder, and wherein the tail bits decoded by the first constituent decoder are bit-by-bit compared with tail bits calculated from information bits derived from the information bits decoded by the second constituent decoder, an error being determined by the determining means if in either of the bit-by-bit comparisons one or more comparisons of corresponding bit values does not match.

11. The apparatus of claim 7 wherein the tail bits decoded by the second constituent decoder are bit-by-bit compared with corresponding tail bits calculated from information bits decoded by the second constituent decoder, wherein the tail bits decoded by the first constituent decoder are bit-by-bit compared with corresponding tail bits calculated from information bits derived from the information bits decoded by the second constituent decoder, wherein the tail bits decoded by the first constituent decoder are bit-by-bit compared with corresponding tail bits calculated from information bits decoded by the first constituent decoder, and wherein the tail bits decoded by the second constituent decoder are bit-by-bit compared with corresponding tail bits calculated from information bits derived from the information bits decoded by the first constituent decoder, an error being determined by the determining means if in any of the bit-by-bit comparisons one or more comparisons of corresponding bit values does not match.

12. The apparatus of claim 7 wherein the calculating means calculates the expected tail bits at the end of a final turbo decoding iteration cycle, the final turbo decoding iteration cycle comprising a first turbo decoding cycle in which the first constituent decoder decodes information bits and associated tail bits of a first constituent code and a next second turbo decoding cycle in which the second constituent decoder decodes information bits and tail bits associated with a second constituent code.

* * * * *